United States Patent [19]

Thackeray et al.

[11] Patent Number: 5,108,875

[45] Date of Patent: *Apr. 28, 1992

[54] PHOTORESIST PATTERN FABRICATION EMPLOYING CHEMICALLY AMPLIFIED METALIZED MATERIAL

[75] Inventors: James W. Thackeray, Braintree; Stephen A. Fine, Peabody, both of Mass.

[73] Assignee: Shipley Company Inc., Newton, Mass.

[*] Notice: The portion of the term of this patent subsequent to May 1, 2007 has been disclaimed.

[21] Appl. No.: 489,028

[22] Filed: Mar. 5, 1990

Related U.S. Application Data

[63] Continuation-in-part of Ser. No. 226,282, Jul. 29, 1988, Pat. No. 4,921,778.

[51] Int. Cl.$^5$ ............................................. G03C 5/16
[52] U.S. Cl. .................................. 430/326; 430/313; 430/327; 430/331
[58] Field of Search ................. 430/327, 313, 326, 331

[56] References Cited

U.S. PATENT DOCUMENTS

| | | | |
|---|---|---|---|
| 4,357,369 | 11/1982 | Kilichowski | 427/90 |
| 4,396,704 | 8/1983 | Taylor | 430/311 |
| 4,426,247 | 1/1984 | Tamamura | 156/643 |
| 4,430,153 | 2/1984 | Gleason | 156/643 |
| 4,433,044 | 2/1984 | Meyer | 430/271 |
| 4,552,833 | 11/1985 | Ito | 430/325 |
| 4,613,398 | 9/1986 | Chiong et al. | 430/325 |
| 4,921,778 | 5/1990 | Thackeray et al. | 430/330 |

Primary Examiner—Charles L. Bowers, Jr.
Assistant Examiner—Thorl Chea
Attorney, Agent, or Firm—Robert L. Goldberg

[57] ABSTRACT

The present invention is directed to a method for the formation, partial wet development and dry development of photoresists treated only in a thin layer (i.e., approx. 2000 Angstroms thick) so as to be treated with an organometallic material. Treatment of this thin layer of the resist formulation in the process of the present invention is preferably accomplished by the vapor phase exposure of the resist formulation to an organometallic material such as a silylating compound capable of reacting with the resist formulation. The resist formulation also contains a photoacid generator, capable of releasing an acid which either causes the hydrolysis of the exposed portions of the resist that were created with organometallic vapor, or prevents the reaction of the organometallic vapor with the exposed portion of the resist.

32 Claims, 1 Drawing Sheet

PHOTORESIST PATTERN FABRICATION EMPLOYING CHEMICALLY AMPLIFIED METALIZED MATERIAL

CROSS REFERENCE TO RELATED APPLICATIONS

This application is a continuation-in-part of copending U.S. application Ser. No. 07/226,282, filed Jul. 29, 1988, now U.S. Pat. No. 4,921,778.

BACKGROUND OF THE INVENTION

The present invention is directed to a method of forming photoresist patterns having micron and submicron dimensions. These photoresists find use in fabrication of complex structures such as those in electronic devices and magnetic thin film heads. The present invention also is directed to unique photoresist compositions that are capable of being used in the present method. The present invention also describes various organometallic reagents that are useful in the present method.

DISCUSSION OF PRIOR ART

Many of the recent advancements in electronic devices and components have resulted from improvements in manufacturing techniques. Some of the most important improvements have occurred in microlithography and in methods of transferring the patterns used to create the complex structures within the electronic devices.

One of the preferred methods of transferring patterns of micron and submicron dimensions is dry etching. This method utilizes plasma or reactive ion etching to remove specific areas of material on a surface so that a pattern remains. In many instances, this method of pattern creation has replaced older processes which used solvent development of a material to create the pattern. These wet processing techniques frequently did not permit the dimensional control desired in the creation of micron and submicron dimensional patterns.

Typically, the material to be dry etched to create a pattern is a polymeric material for reasons of ease of use, material properties and cost considerations. When an organic polymer is used, dry etching can be done using an oxygen plasma or oxygen reactive ion etching.

During oxygen plasma and/or oxygen reactive ion etching, the organic content of a polymer is converted to a gaseous form which is easily removed. In order to create the desired pattern, there must be some areas of the polymeric material which are made resistant to the etching materials, and other areas which are not reactive therewith.

One method of producing such an etch-resistant polymeric material is to utilize a polymeric resist material containing silicon in a sufficiently large quantity so that exposure to oxygen plasma, for example, results in formation of silicon oxides, which form a protective layer and prevent the conversion of the polymer to its gaseous form.

Examples of silicon-containing copolymers, comprising a compound containing an acrylate moiety and a silicon containing oxime ester of methacrylic acid, which act as a positive resist and which can be dry developed are disclosed in U.S. Pat. No. 4,433,044 to Meyer et al.

A method of selectively removing a portion of a layer of material on a substrate by oxygen plasma etching, utilizing a mask of resist material comprising a poly (silane sulfone) copolymer is disclosed in U.S. Pat. No. 4,357,369 to Kilichowksi et al. A method of producing solid state devices by dry etching of a resist film comprising a silicon-containing or nonsilicon-containing but organometallic monomer-containing polymer is described in U.S. Pat. No. 4,396,704 to Taylor.

Another method for forming a micropattern using a technique similar to those set forth above is disclosed in U.S. Pat. No. 4,430,153 to Gleason et al. The method involves forming an etch barrier in the reactive ion etching of an aromatic polyamic acid/imide polymer.

Another method for forming a micropattern using a technique similar to those above is disclosed in U.S. Pat. No. 4,426,247 to Tamamura et al.

Recently, processes have been developed which permit selective conversion of portions of a nonsilicon-containing resist to a silicon-containing etch-resistant resist. The nonsilicon-containing resist is exposed to patterned radiation to create a latent image within the resist. Examples of this method of obtaining dry-developable multilayer resists are described in U.S. Pat. No. 4,552,833.

In U.S. Pat. No. 4,613,398 to Choing et al, there is described a method for producing oxygen etch-resistant polymeric films which incorporate a protective oxide-forming metal permeated into the polymer. These films are useful as positive tone resist patterns for use with dry development techniques.

The present invention represents yet another advance in this art. It has been found that by replacing the post exposure bake with a partial wet development process, silicon particles that tend to remain in the exposed areas are removed prior to dry development resulting in cleaner images.

SUMMARY OF THE INVENTION

The present invention is directed to a method for the formation and dry development of photoresist formulations treated in at least a portion of the thin top layer thereof, with an acid-hydrolyzeable organometallic material.

The present invention is also directed to a method using unique photoresist formulations that contain one or more photo-acid generators (PAGs). These compounds release strong acid in the presence of light, and can either (a) remove an organometallic material from the polymeric backbone by hydrolysis, or (b) prevent an organometallic material from reacting with a polymeric backbone. The photoresist formulation is not limited to PAGs, but photo-acid components (PACs) are also useful.

The present invention is also directed to a method of using organometallic materials that react with the polymeric backbone of the resist formulation to provide etch mask character.

DESCRIPTION OF THE PREFERRED EMBODIMENTS

Figure 1:
FIG. 1-5 illustrate schematically one preferred embodiment of the present invention wherein vapor phase organometallic treatment occurs prior to exposure of the resist.

This invention represents a process utilizing unique surface chemistry combined with dry development processing and unique resist compositions useful thereof. The process schemes of the preferred process is outlined in FIGS. 1-5. This invention also describes the use of organometallic reagents of a specific type and character.

The reagents and methods of the present invention afford increased resolution ability in resist pattern fabrication due to the fact that only about 2000 Angstroms of the resist film needs to be exposed. This eliminates previous concerns of phenolic absorption in the film.

Also, the use of a partial wet develop process instead of a post exposure bake provides for cleaner images by removing silicon from the exposed areas and preventing formation of grass.

It will be recognized by those of ordinary skill in this art that this process relies on unique surface chemistry and is based upon the discovery that certain preferred materials are capable of hydrolyzing the trimethyl silyl group from a poly(p-vinyl) phenol or novolak backbone.

While the drawings call specifically for one preferred organometallic treatment (i.e., silylation) it is to be understood that this is merely illustrative of the presently most preferred embodiment, and that the alternative organometallic compounds described herein can readily be substituted in the process schemes outlined in the drawings accompanying this disclosure.

Figure 2:
Figure 3:
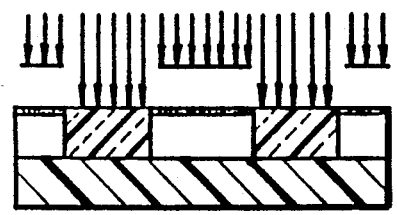
Figure 4:
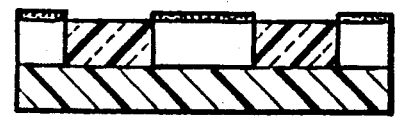

Referring in detail to the drawings, it will be appreciated that, as illustrated in FIG. 1, a substrate is initially coated with a resist formulation containing a photoacid generator. A thin (e.g. <2000 Angstrom) layer of silylated resist is formed as shown in FIG. 2. Exposure of this coated resist film to deep UV radiation releases the strong photogenerated acid in the exposed areas which desilylates the film in the exposed areas, FIG. 3. The next step involves use of a partial wet develop process to remove silicon from the exposed areas, FIG. 4.

Figure 5:

Dry development of the resulting partially desilylated resist film using a conventional oxygen etch system, affords the desired pattern, a positive tone image as shown in FIG. 5.

As the acid-hydrolizeable organometallic material employed herein, the skilled artisan will readily recognize that in addition to HMDS, numerous other organometallic compounds of this type are available for use herein.

One preferred group of such compounds are the tetra-substituted organometallic species. These compounds have the generic formula:

$$R_1R_2R_3R_4\text{-}M$$

wherein;

M is selected from the group consisting of Si, Sn, Ti, P, Ge, and Zr, preferably Si; and the organic substituents $R_1$-$R_4$ are each independently selected from the group consisting of alkyl, preferably $C_1$-$C_{16}$, more preferably $C_1$-$C_{10}$, most preferably, $C_1$-$C_6$; aryl, preferably phenyl or aklyl substituted phenyl; and a suitable leaving group such as halogen, preferably Cl, Br, or I.

Similarly, substituted organometallic amine species such as;

$$(R_1R_2R_3\text{-}M)_{2+x}\text{NH}_{1-x}$$

wherein;
x=0 or 1;

M is selected from the group consisting of Si, Sn, Ti, Ge, and Zr, preferably Si; and the organic substituents $R_1$-$R_3$ are each independently selected from the group consisting of alkyl, preferably $C_1$-$C_{16}$, more preferably $C_1$-$C_{10}$, most preferably, $C_1$-$C_6$; and aryl, preferably phenyl, alkyl substituted phenyl; may be used herein.

As described above, the most preferred compound of this type, HMDS, which is more completely known as 1,1,1,3,3,3-hexamethyldisilazane, has the formula:

$$(CH_3)_3\text{—Si—NH—Si—}(CH_3)_3$$

Of the PAGs and PACs useful herein, the skilled artisan will readily be able to select from the available compounds of this type. One preferred class of such PAGs are the onium salts. Photoresist systems typically utilize a film-forming epoxy resin binder and an onium salt photoinitiator capable of activation by exposure.

Onium salts, particularly those with weakly nucleophilic anions, have been found to be particularly suitable for such systems. Examples of such anions are the halogen complex anions of divalent to heptavalent metals or non-metals, for examle, Sb, Sn, Fe, Bi, Al, Ga, In, Ti, Zr, Sc, D, Cr, Hf, and Cu as well as B, P, and As. Examples of suitable onium salts are diaryldiazonium salts and onium salts of group Va and b, Ia and b and I of the Periodic Table, for example, halonium salts, particularly aromatic iodonium and iodoxonium salts, quaternary ammonium, phosphonium and arsonium salts, aromatic sulfonium salts and sulfoxonium salts or selenonium salts.

Examples of suitable resins can be found in the referenced patents.

One preferred resist formulation of the present invention contains poly(p-vinyl) phenol and as a photoacid generator, a halogenated aromatic compound of the formula:

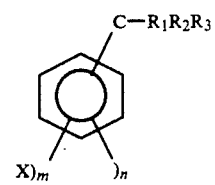

wherein:
x=CL, Br, F, or I;
n is an integer from 1 to 10 inclusive;
m is an integer from 1 to 10 inclusive; and
the organic substituents $R_1$-$R_3$ are each independently selected from the group consisting of alkyl or aryl groups.

Another preferred resist formulation of the present invention contains poly(p-vinyl) phenol and a photoacid generator consisting of halogenated aromatic compounds of the formula:

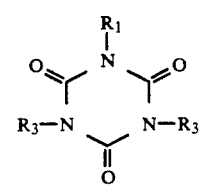

wherein:
the substituents $R_1-R_3$ are each independently selected from the group consisting of hydrogen, and halogenated (F, Br, Cl, I) alkyl groups. An especially preferred PAG of this type is tris(2,3-dibromopropyl)-isocyanurate.

After mixing the various ingredients in a suitable solvent, the resist formulation is first spin coated and pre-baked.

In one preferred embodiment of the method of the present invention, the resist film containing either a PAG, a PAC, or mixtures thereof, is then subjected to a thin film treatment by the acid hydrolyzable organometallic compound, i.e., reaction of the organometallic compound with no more than about the first 2000 Angstroms thickness of polymer backbone comprising the film. The remaining thickness of the resist film stays unreacted.

This thin-film reacted resist film is next exposed with deep UV irradiation. In the exposed areas, a photo-generated acid is produced which causes the hydrolysis of the organometallic species from the poly(p-vinyl) phenol backbone. Partial wet development of the exposed areas removes excess silicon particles prior to dry development.

The present invention will be further illustrated with reference to the following examples which will aid in the understanding of the present invention, but which are not to be construed as a limitation thereof. All percentages reported herein, unless otherwise specified, are percent by weight. All temperatures are expressed in degrees Celsius.

EXAMPLE 1

A resist solution containing twenty-five percent (25%) by weight m,p-cresol novolak and ten percent (10%) by weight diphenyl iodonium hexafluoroarsenate was formulated in diethylene glycol monomethyl ether acetate. The resist solution was coated to 2.0 micron thickness at 4,000 rpm with a 105° C., 1 minute softbake. The resist coating was silylated, in a Yield Engineering System Silyation oven with 100 torr, with hexamethyl disilazane at 100° C. for 15 minutes. The resist film swelled 2,000 angstroms. The resist coating was then exposed to 30-300 mJ/cm² of deep UV (240-270 nm) light from a mercury-xenon exposure source. After standing for 30 minutes, the resist was placed in MF-312 developer, and approximately 1500 angstroms of the exposed areas were developed out. The resist film was subsequently plasma etched with 20 sccm oxygen, 20 mtorr pressure, 100 watts bias. After 20% overetch, 1.5 micron of unexposed resist remained, and the exposed areas were cleanly etched.

EXAMPLE 2

A resist solution containing twenty-five percent (25%) by weight m,p-cresol novolak and five percent (5%) by weight tris(2,3-dibromopropyl)isocyanurate was formulated in diethylene glycol monomethyl ether acetate. The resist solution was coated to 1.0 micron thickness at 4,000 rpm with a 90° C., 1 minute softbake. The resist coating was silylated in a Yield Engineering Systems silylation oven with 100 torr hexamethyl disilazane at 100° C. for 15 minutes. The resist coating was then exposed to 30-300 mJ/cm² of deep UV (240-270 nm) light from a mercury-xenon exposure source. After standing for 10 minutes, the resist was developed in MF-319 developer. Approximately 1500 angstroms of the exposed areas developed out. The resist film was subsequently plasma etched with 20 sccm oxygen, 20 mtorr pressure, 100 watts bias. After 20% overetch, 0.6 microns of unexposed resist remained, and the exposed areas were cleanly etched.

The present invention has been described in detail, including the preferred embodiments thereof. However, it will be appreciated that those skilled in the art, upon consideration of the present disclosure, may make modifications and/or improvements on this invention and still be within the scope and spirit of this invention as set forth in the following claims.

What is claimed is:

1. A method of forming a patterned layer on a substrate comprising:
    (a) coating the substrate with a polymeric photoresist composition containing one or more photoacid generating agents or photoacid components;
    (b) drying the coating to form a resist film;
    (c) coating the resist film with a thin layer of an organometallic reagent;
    (d) exposing selected portions of the coated film with a source of radiation, thereby producing strong acids which convert the organometallic reagent to a hydrolyzed by-product product;
    (e) partial wet developing to remove portions of said hydrolyzed by-product; and
    (f) dry developing the film to remove the remaining reactive portions by etching in an oxygen plasma.

2. The method of claim 1 wherein the polymeric materials in the photoresist composition are selected from the group consisting of poly(p-vinyl)phenols, the novolak resins, polyvinyl pyrollidones, and mixtures thereof.

3. The method of claim 1 wherein the photoacid generator is selected from the group consisting of halogenated aromatic compounds of the formula:

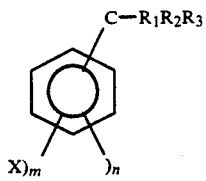

wherein:
   $X = Cl$, Br, F, or I;
   n is an integer from 1 to 10 inclusive;
   m is an integer from 1 to 10 inclusive; and the organic substituents $R_1-R_3$ are each independently selected from the group consisting of alkyl or aryl groups.

4. The method of claim 3 wherein the organic substituents $R_1-R_3$ are each independently $C_1-C_{16}$ alkyl groups.

5. The method of claim 3 wherein the organic substituents $R_1-R_3$ are each independently $C_1-C_{10}$ groups.

6. The method of claim 3 wherein the organic substituents $R_1-R_3$ are each independently $C_1-C_6$ groups.

7. The method of claim 3 wherein the organic substituents $R_1-R_3$ are each independently phenyl or alkyl substituted phenyl.

8. The method of claim 1 wherein the photoacid generator is selected from the group consisting of halogenated aromatic compounds of the formula:

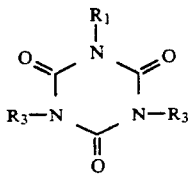

wherein:
the substituents $R_1$-$R_3$ are each independently selected from the group consisting of hydrogen, and halogenated (F, Br, Cl, I) alkyl groups.

9. The method of claim 8 wherein the halogenated alkyl groups are each independently $C_1$-$C_{16}$ alkyl groups.

10. The method of claim 8 wherein the halogenated alkyl groups are each independently $C_1$-$C_{10}$ groups.

11. The method of claim 8 wherein the halogenated alkyl groups are each independently $C_1$-$C_6$ groups.

12. The method of claim 1 wherein the photoacid generator is selected from the group of onium salts comprising halonium salts, ammonium salts, phosphonium salts, arsonium salts, aromatic sulfonium salts, sulfoxonium salts or selenonium salts.

13. The method of claim 1 wherein the organometallic compound is selected from the compounds having the formula:

$$R_1R_2R_3R_4\text{-M}$$

wherein:
M is selected from the group consisting of Si, Sn, Ti, P, Ge, and Zr; and
the organic substituents $R_1$-$R_4$ are each independently selected from the group consisting of alkyl, aryl, and a suitable leaving group, with the proviso that one such substituent is a leaving group.

14. The method of claim 13 wherein M is Si.

15. The method of claim 13 wherein up to three of the organic substituents $R_1$-$R_4$ are each independently selected from the group consisting of $C_1$-$C_{16}$ alkyl.

16. The method of claim 13 wherein up to three of the organic substituents $R_1$-$R_4$ are each independently selected from the group consisting of $C_1$-$C_{10}$ alkyl.

17. The method of claim 13 wherein up to three of the organic substituents $R_1$-$R_4$ are each independently selected from the group consisting of $C_1$-$C_6$ alkyl.

18. The method of claim 13 wherein up to three of the organic substituents $R_1$-$R_4$ are each independently selected from the group consisting of phenyl or alkyl substituted phenyl.

19. The method of claim 13 wherein at least one of the leaving groups is halogen selected from the group consisting of F, Cl, Br, or I.

20. The method of claim 13 wherein at least one of the leaving groups is an amino group of the formula $NR_1R_2$.

21. The method of claim 13 wherein at least one of the leaving groups is an alkoxy group of the formula $OR_1$.

22. The method of claim 1 wherein the organometallic compound is selected from the compounds having the formula:

$$(R_1R_2R_3\text{-M})_{2+x}\text{-NH}_{1-x}$$

wherein;
$x = 0$ or $1$;
M is selected from the group consisting of Si, Sn, Ti, Ge, and Zr; and
the organic substituents $R_1$-$R_3$ are each independently selected from the group consisting of alkyl and aryl.

23. The method of claim 22 wherein M is Si.

24. The method of claim 22 wherein the organic substituents $R_1$-$R_3$ are each independently selected from the group consisting of $C_1$-$C_{16}$ alkyl.

25. The method of claim 22 wherein the organic substituents $R_1$-$R_3$ are each independently selected from the group consisting of $C_1$-$C_{10}$ alkyl.

26. The method of claim 22 wherein the organic substituents $R_1$-$R_3$ are independently selected from the group consisting of $C_1$-$C_6$ alkyl.

27. The method of claim 22 wherein the organic substituents $R_1$-$R_3$ are each independently selected from the group consisting of phenyl and alkyl substituted phenyl.

28. The method of claim 1 wherein the photoactive compound is selected from compounds having the formula:

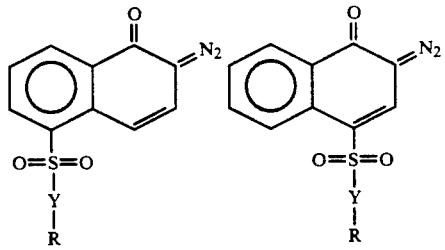

wherein
Y is selected from the group consisting of O, S, N, and C; and
R is selected from the group consisting of alkyl and aryl substituents.

29. The method of claim 26 wherein R is selected from the group consisting of $C_1$-$C_{16}$ alkyl.

30. The method of claim 26 wherein R is selected from the group consisting of $C_1$-$C_{10}$ alkyl.

31. The method of claim 26 wherein R is selected from the group consisting of $C_1$-$C_6$ alkyl.

32. The method of claim 26 wherein R is selected from the group consisting of phenyl and alkyl substituted phenyl.

* * * * *